United States Patent
Darolia et al.

(10) Patent No.: US 6,887,589 B2
(45) Date of Patent: May 3, 2005

(54) NICKEL ALUMINIDE COATING AND COATING SYSTEMS FORMED THEREWITH

(75) Inventors: Ramgopal Darolia, West Chester, OH (US); Joseph David Rigney, Milford, OH (US); William Scott Walston, Mason, OH (US); Jeffrey Allan Pfaendtner, Blue Ash, OH (US); Brett Allen Rohrer Boutwell, Liberty Township, OH (US); Irene Spitsberg, Loveland, OH (US); James Anthony Ruud, Delmar, NY (US)

(73) Assignee: General Electric Company, Schenectady, NY (US)

(*) Notice: Subject to any disclaimer, the term of this patent is extended or adjusted under 35 U.S.C. 154(b) by 0 days.

(21) Appl. No.: 10/249,564

(22) Filed: Apr. 18, 2003

(65) Prior Publication Data

US 2004/0209110 A1 Oct. 21, 2004

(51) Int. Cl.[7] .............................. B32B 15/04; F03B 3/12
(52) U.S. Cl. ....................... 428/633; 428/632; 428/650; 428/680; 428/325; 428/698; 416/241 R
(58) Field of Search ................... 428/632, 633, 428/650, 655, 678, 679, 680, 323, 325, 332, 698; 416/241 B, 241 R

(56) References Cited

U.S. PATENT DOCUMENTS

| | | | |
|---|---|---|---|
| 4,101,713 A | 7/1978 | Hirsch et al. | 428/554 |
| 4,447,503 A | 5/1984 | Dardi et al. | 428/632 |
| 4,451,496 A | 5/1984 | Gedwill et al. | 427/456 |
| 5,015,502 A | 5/1991 | Strangman et al. | 427/248 |
| 6,093,454 A | 7/2000 | Brindley et al. | 427/456 |
| 6,153,313 A | 11/2000 | Rigney et al. | |
| 6,168,874 B1 | 1/2001 | Guta et al. | 428/623 |
| 6,291,014 B1 | 9/2001 | Warnes et al. | 427/252 |
| 6,306,515 B1 | 10/2001 | Goedjen et al. | 428/469 |
| 6,376,015 B1 | 4/2002 | Rickerby | 427/250 |
| 6,485,792 B1 | 11/2002 | Grylls et al. | |
| 6,485,845 B1 | 11/2002 | Wustman et al. | 428/633 |
| 6,682,827 B2 * | 1/2004 | Darolia et al. | 428/632 |

FOREIGN PATENT DOCUMENTS

| | | |
|---|---|---|
| EP | 1254967 | 11/2002 |
| WO | WO2004011688 | 5/2004 |

* cited by examiner

*Primary Examiner*—Jennifer McNeil
(74) *Attorney, Agent, or Firm*—David L. Narciso; Gary M. Hartman; Domenica N. S. Hartman

(57) ABSTRACT

A beta-phase NiAl overlay coating containing a dispersion of ceramic particles and a process for depositing the overlay coating. If the coating is used to adhere a thermal barrier coating (TBC), the TBC exhibits improved spallation resistance as a result of the dispersion of ceramic particles having a dispersion-strengthening effect on the overlay coating. The overlay coating contains at least one reactive element and is deposited so that the some of the reactive element deposits as the ceramic particles dispersed in the overlay coating.

16 Claims, 1 Drawing Sheet

NICKEL ALUMINIDE COATING AND COATING SYSTEMS FORMED THEREWITH

FEDERAL RESEARCH STATEMENT

This invention was made with Government support under Agreement No. F33615-98-C-2893 awarded by the U.S. Department of the Air Force. The Government has certain rights in the invention.

BACKGROUND OF INVENTION

1. Field of the Invention

The present invention generally relates to coatings of the type used to protect components exposed to high temperature environments, such as bond coats and environmental coatings for gas turbine engine components. More particularly, this invention is directed to a ceramic-containing beta-phase ($\beta^2$) NiAl (beta-NiAl) overlay coating for use as a bond coat or environmental coating.

2. Description of the Related Art

Components within the turbine, combustor and augmentor sections of gas turbine engines are susceptible to oxidation and hot corrosion attack, in addition to high temperatures that can decrease their mechanical properties. Consequently, these components are often protected by an environmental coating alone or in combination with an outer thermal barrier coating (TBC), which in the latter case is termed a TBC system. Ceramic materials such as zirconia ($ZrO_2$) partially or fully stabilized by yttria ($Y_2O_3$), magnesia (MgO) or other oxides, are widely used as TBC materials.

Various metallic coating systems have been used as environmental coatings for gas turbine engine components, the most widely used being diffusion coatings such as diffusion aluminides and platinum aluminides (PtAl), and MCrAlX overlay coatings (where M is iron, cobalt and/or nickel, and X is an active element such as yttrium or another rare earth or reactive element). Used in combination with TBC, a diffusion aluminide or MCrAlX overlay coating serves as a bond coat to adhere the TBC to the underlying substrate. The aluminum content of these bond coat materials provides for the slow growth of a strong adherent continuous aluminum oxide layer (alumina scale) that protects the bond coat and underlying substrate from oxid.

Diffusion and MCrAlX bond coats containing ceramic particles have been evaluated. For example, commonly-assigned U.S. Pat. Nos. 6,168,874 to Gupta et al. and 6,485,845 to Wustman et al. incorporate oxide particles in diffusion aluminide coatings to slow oxide scale growth, thereby increasing the spallation resistance of a TBC. Furthermore, commonly-assigned U.S. Pat. No. 4,101,713 to Hirsch et al. discloses that an oxide dispersion-strengthened MCrAlY coating exhibits improved mechanical integrity. Others, such as U.S. Pat. No. 4,447,503 to Dardi et al., disclose that oxide particles in an MCrAlY coating promote pinning protective oxide scales, while still others, such as U.S. Pat. No. 4,451,496 to Gedwill et al., U.S. Pat. No. 6,306,515 to Goedjen et al. and U.S. Pat. No. 6,376,015 to Rickerby, disclose the use of oxide particles in MCrAlY as an inhibitor to interdiffusion between an underlying substrate and an environmental coating deposited on the MCrAlY coating. The incorporation of oxide particles in an MCrAlY for the purpose of modifying its coefficient of thermal expansion has also been suggested, e.g., U.S. Pat. No. 6,093,454 to Brindley et al., EP 0 799 904 to Movchan et al., and EP 0 340 791 to Kojima et al. Finally, the incorporation of other types of ceramic particles in bond coat materials has been suggested, as reported in U.S. Pat. No. 6,291,014 to Warnes et al. (suicides and carbides for high temperature oxidation resistance).

More recently, overlay coatings of predominantly beta-nickel aluminide intermetallic have been proposed as environmental and bond coat materials. The NiAl beta phase exists for nickel-aluminum compositions of about 30 to about 60 atomic percent aluminum, the balance of the nickel-aluminum composition being nickel. Notable examples of beta-NiAl coating materials include commonly-assigned U.S. Pat. No. 5,975,852 to Nagaraj et al., which discloses a NiAl overlay bond coat optionally containing one or more reactive elements, such as yttrium, cerium, zirconium or hafnium, and commonly-assigned U.S. Pat. No. 6,291,084 to Darolia et al., which discloses a NiAl overlay coating material containing chromium and zirconium. Commonly-assigned U.S. Pat. Nos. 6,153,313 and 6,255,001 to Rigney et al. and Darolia, respectively, and commonly-assigned U.S. Patent No. 6,620,524 to Pfaendtner et al. also disclose beta-phase NiAl bond coat and environmental coating materials. The alloying additions to these beta-NiAl coating materials have been shown to improve the adhesion of a ceramic TBC layer, thereby inhibiting spallation of the TBC and increasing the service life of the TBC system.

NiAlCrZr overlay coatings described in the above-noted commonly-assigned patents derive their performance benefits from optimum combinations of aluminum and the reactive elements, chromium and zirconium. At certain levels, zirconium promotes an adherent slow growing (low values of the parabolic scale growth parameter, $k_p$) alumina scale, which helps to extend the TBC spallation life and improve oxidation performance. While oxidation performance suffers if the zirconium level is too low (e.g., below 0.05 atomic percent), higher levels of zirconium result in Zr-rich intermetallic precipitates that can increase internal oxidation. In spite of this internal oxidation phenomenon, levels of zirconium above 0.2 atomic percent (about 0.4 weight percent) have shown to significantly improve TBC spallation resistance as a result of the potent strengthening effect of zirconium additions to beta-NiAl alloys. Strengthening in beta-NiAl by zirconium additions has been attributed to two mechanisms: solid solution strengthening, and the formation of zirconium-containing intermetallic precipitates, the most common being a Heusler phase ($Ni_2AlZr$) that results in further ordering of the NiAl structure. The increased strength of beta-phase NiAl-based bond coats has been shown to contribute to better TBC lives.

However, and as mentioned above, the higher zirconium levels required to optimize TBC spallation resistance also promote internal oxidation (oxidation of Zr-intermetallic precipitates), which degrades the overall oxidation resistance of the bond coat by effectively increasing the parabolic scale growth parameter, $k_p$. While it is critical that a bond coat provide TBC spallation resistance, bond coats must also exhibit oxidation resistance in the event of TBC spallation. Therefore, further improvements are needed in beta-phase NiAl-based overlay coatings that can result in both improved oxidation resistance and, if used as a bond coat, improved spallation resistance.

SUMMARY OF INVENTION

The present invention generally provides a beta-NiAl overlay coating and a process for forming the coating on a component designed for use in a hostile thermal environment, such as superalloy turbine, combustor and augmentor components of a gas turbine engine. According to one aspect of the invention, the coating system includes a ceramic topcoat that exhibits improved spallation resistance as a result of the beta-phase NiAl overlay coating containing a dispersion of ceramic particles, yielding a coating system capable of exhibiting improved oxidation and spallation resistance.

More particularly, the beta-NiAl overlay coating contains at least one reactive element and is deposited so that at least some of the reactive element deposits as ceramic particles dispersed in the overlay coating. The ceramic particles are present in an amount and size sufficient to be stable and unreactive at temperatures up to about 1300Å° C. and to increase the strength of the overlay coating by a dispersion strengthening mechanism. In one example, zirconium and chromium are constituents of the overlay coating, and are reacted during the deposition process to form oxides, carbides and/or nitrides. Notably, significantly improved oxidation and spallation resistance can be achieved with a beta-NiAl overlay coating containing zirconium and chromium by reacting some of the zirconium and chromium during the coating process to form a fine and uniform dispersion of submicron ceramic particles throughout the overlay coating.

Other objects and advantages of this invention will be better appreciated from the following detailed description.

DETAILED DESCRIPTION

The present invention provides a composition and process for achieving a desirable combination of environmental properties in a predominantly beta-phase NiAl-based coating containing reactive element additions. In NiAl-based coatings of this invention, reactive element additions are incorporated to a level necessary for optimum oxidation resistance (i.e., below levels that would lead to excessive $k_p$ values) without significantly exceeding the solid solution limit of the element, while additional bond coat strength (needed for TBC spallation resistance) is provided by a stable dispersion of oxides, carbides and/or nitrides of the reactive element, e.g., zirconia ($ZrO_2$), hafnia ($HfO_2$), chromia ($Cr_2O_3$), yttria ($Y_2O_3$), ceria ($CeO_2$), zirconium carbide (ZrC), hafnium carbide (HfC), etc., and possibly oxides, carbides and/or nitrides of other elements of the coating, e.g., alumina ($Al_2O_3$), aluminum nitride (AlN), etc.

Figure 1:
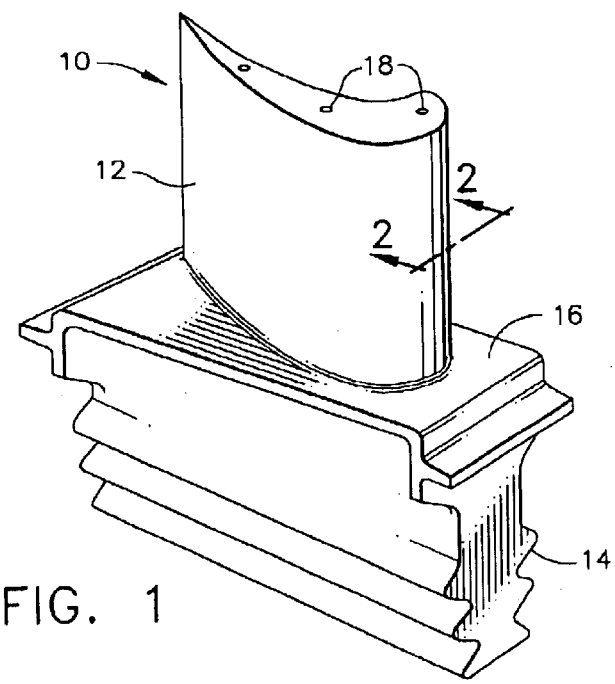
FIG. 1 is a perspective view of a high pressure turbine blade.

In view of the above, beta-NiAl-based coatings of this invention are useful on components that operate within environments characterized by relatively high temperatures, and therefore subjected to severe thermal stresses and thermal cycling. Notable examples of such components include the high and low pressure turbine nozzles and blades, shrouds, combustor liners and augmentor hardware of gas turbine engines. One such example is the high pressure turbine blade 10 shown in FIG. 1. The blade 10 generally includes an airfoil 12 against which hot combustion gases are directed during operation of the gas turbine engine, and whose surface is therefore subjected to severe attack by oxidation, corrosion and erosion. The airfoil 12 is anchored to a turbine disk (not shown) with a dovetail 14 formed on a root section 16 of the blade 10. Cooling holes 18 are present in the airfoil 12 through which bleed air is forced to transfer heat from the blade 10. While the advantages of this invention will be described with reference to the high pressure turbine blade 10 shown in FIG. 1, and particularly nickel-base superalloy blades of the type shown in FIG. 1, the teachings of this invention are generally applicable to any component on which a coating system may be used to protect the component from its environment.

Figure 2:
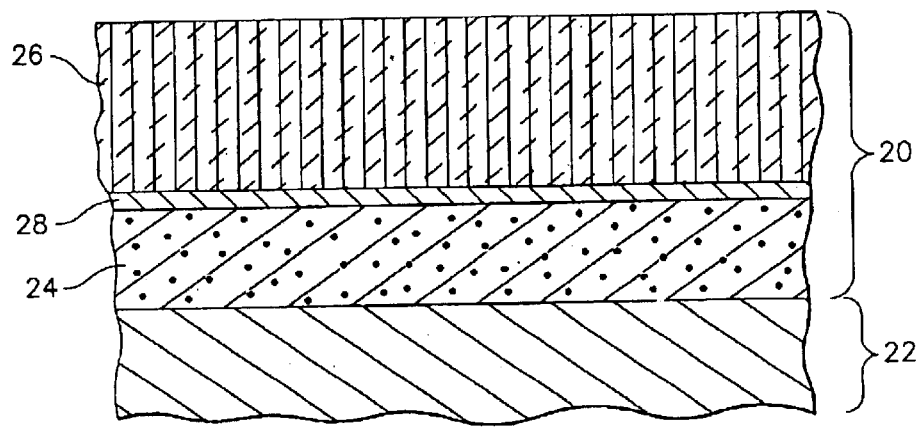
FIG. 2 is a cross-sectional view of the blade of FIG. 1 along line 2—2, and shows a thermal barrier coating system in accordance with an embodiment of this invention.

FIG. 2 depicts a representative TBC system 20 for discussing the present invention. As shown, the coating system 20 includes a ceramic layer 26 bonded to the blade substrate 22 with a beta-phase NiAl-based overlay coating 24, which therefor serves as a bond coat to the ceramic layer 26. The substrate 22 (blade 10) is preferably a high-temperature material, such as an iron, nickel or cobalt-base superalloy. The ceramic layer 26 is depicted as having a strain-tolerant columnar grain structure as a result of being deposited by a physical vapor deposition (PVD) technique, though other deposition techniques could be used. A preferred material for the ceramic layer 26 is an yttria-stabilized zirconia (YSZ), with a suitable composition being about 3 to about 20 weight percent yttria, though other ceramic materials could be used, such as yttria, nonstabilized zirconia, or zirconia stabilized by ceria ($CeO_2$), scandia ($Sc_2O_3$) or other oxides. The ceramic layer 26 is deposited to a thickness that is sufficient to provide the required thermal protection for the underlying substrate 22 and blade 10, generally on the order of about 100 to about 300 micrometers. As with prior art TBC systems, the surface of the overlay coating 24 oxidizes to form an oxide surface layer (scale) 28 to which the ceramic layer 26 chemically bonds.

In accordance with this invention, the overlay coating 24 is predominantly of the beta NiAl phase, with limited alloying additions. The overlay coating 24 can be deposited using a PVD process such as cathodic arc or electron beam PVD (EBPVD), or by thermal spraying such as plasma spraying (air, vacuum and low pressure) and high velocity oxy-fuel (HVOF) spraying. A suitable thickness for the overlay coating 24 is about 50 micrometers to protect the underlying substrate 22 and provide an adequate supply of aluminum for oxide formation, though thicknesses of about 10 to about 125 micrometers are believed to be suitable. Following deposition, the coating 24 may be heat treated to promote homogenization and adherence (by interdiffusion with the substrate). If performed, a suitable heat treatment is about two to about four hours at about 1800Å° F. to 2100Å° F. (about 980Å° C. to about 1150Å ° C.) in a vacuum or an inert atmosphere such as argon.

To attain the beta-NiAl intermetallic phase, the NiAl overlay coating 24 preferably has an aluminum content of about 30 to 60 atomic percent, more preferably about 30 to 50 atomic percent, and most preferably at the stoichiometric ratio of 1:1 with nickel. According to this invention, the coating 24 also contains one or more reactive elements, preferably zirconium, though additions of hafnium and/or yttrium are also contemplated by this invention. If zirconium, the reactive element is present in an amount of at least 0.05 atomic percent (about 0.1 weight percent) up to as much as about 0.8 atomic percent (about 1.6 weight percent), with a preferred range being about 0.2 to about 0.5 atomic percent (about 0.4 to about 1.0 weight percent). If hafnium in stoichiometric beta-NiAl, the reactive element is present in an amount of at least 0.1 atomic percent (about 0.4 weight percent) up to as much as about 1.0 atomic percent (about 4 weight percent), preferably about 0.2 to about 0.7 atomic percent (about 0.8 to about 2.8 weight percent). If the coating 24 contains more than one reactive element, the total reactive element content is preferably not greater than about 1.0 atomic percent (about 4.0 weight percent).

In a preferred embodiment of the invention, the coating 24 is further alloyed to contain chromium, such as in an amount of about 2 to about 15 atomic percent (about 2.2 to about 18 weight percent), more preferably about 2 to about 10 atomic percent (about 2.2 to about 12 weight percent). According to U.S. Pat. No. 6,291,084 to Darolia et al., the presence of chromium in a beta-NiAl overlay coating has a significant effect on the spallation resistance of the ceramic layer 26 adhered to the NiAl overlay coating 24 as a result of solid solution strengthening by chromium and precipitation strengthening from fine $\alpha$-Cr phases dispersed within the beta phase of the coating 24. However, as with the reactive element content of the overlay coating 24, the chromium content of the coating 24 is also beneficial if present in a nonmetallic form.

As depicted in FIG. 2, the beta-NiAl overlay coating 24 of this invention contains a fine dispersion of ceramic particles 30 (not to scale). These particles, which are oxides, carbides and/or nitrides of at least the reactive element(s) of the coating 24, have been shown to increase the spallation resistance of the ceramic layer 26 deposited on the NiAl overlay coating 24. During testing of EBPVD-deposited NiAlCrZr bond coats of the type disclosed in U.S. Pat. Nos. 6,153,313, 6,255,001, and 6,291,084, certain coatings have at times exhibited exceptional TBC spallation performance in furnace cycle testing (FCT) and burner rig testing. However, these results were accompanied by a prohibitively large amount of scatter in FCT performance that could not be correlated to the concentration of reactive elements in the coatings. In analyzing various factors that influence FCT life, it was noticed that significant shifts in FCT performance tended to occur following major changes in the EBPVD process, such as a change in the deposition rate or the type of heating element used to heat the samples during coating. Although the effects of these process changes were not fully understood, it was speculated that such changes could influence the concentration, size, and distribution of impurity defects within a NiAlCrZr overlay coating.

The present invention arises from data obtained from FCT and burner rig testing that suggested that carbide and oxide impurities may play an important role in the performance of NiAlCrZr bond coats. These investigations involved NiAlCrZr coatings deposited by EBPVD and HVOF and chemically analyzed using a time-of-flight secondary ion mass spectroscopy (TOF-SIMS) technique.

In the FCT investigation, a NiAlCrZr coating was deposited by EBPVD to a thickness of about 25 micrometers on a one-inch (about 25 mm) diameter button coupon formed of a single-crystal superalloy known as René N6 (U.S. Pat. No. 5,455,120), with a nominal composition of, by weight, about 12.5% Co, 4.2% Cr, 7.2% Ta, 5.75% Al, 5.75% W, 5.4% Re, 1.5% Mo, 0.15% Hf, 0.05% C, the balance nickel and incidental impurities. The concentrations of aluminum, chromium and zirconium in the coating were determined by electron microprobe analysis (EMPA) to be, by weight, about 21%, about 3%, and about 0.9%, respectively. A TBC of 7YSZ (zirconia stabilized by about seven weight percent yttria) was deposited on the overlay coating to a thickness of about 125 micrometers. After removing a small piece that included a portion of the NiCrAlZr coating, the button underwent FCT testing at about 2125° F. (about 1160° C.) in one-hour cycles to evaluate the spallation life potential of the TBC coating. Testing was terminated when approximately twenty percent of the TBC had spalled. The FCT life of the coating system was about 1380 cycles, approximately 6X the baseline life of 230 cycles for an identical TBC deposited on a PtAl diffusion coating. A post-test metallographic examination revealed the NiAlCrZr coating to be very flat with no visible plastic deformation or rumpling.

The as-coated piece from this button was then metallographically mounted, polished and subjected to TOF-SIMS analysis. Analysis of the integrated signal intensities and observation of the intensities of oxide and carbide maps unexpectedly showed that some of zirconium and chromium in the coating was in the form of a fine and uniform dispersion (sub-micron scale) of zirconium and chromium carbides and, to a lessor extent, zirconium oxides. A small amount of zirconium remained in the elemental state to strengthen the bond coat by a solid-solution mechanism. Notably, a zirconium-free NiAlCr overlay bond coat subjected to identical FCT testing exhibited a life of only about 160 cycles—only about 11% of the FCT life of the Zr-containing sample. The NiAlCr sample exhibited rumpling (large-scale surface deformation) after testing that was characteristic of PtAl bond coats. These results confirmed that zirconium is a very desirable constituent of an NiAlCr coating for long TBC spallation life. Of significance, these results also indicated that longer TBC life can be achieved, perhaps more consistently, if the coating is deposited so that a portion of the zirconium is in the form of zirconium carbides and/or oxides, which appear to further promote spallation life through a mechanical strengthening mechanism. While not wishing to be held to any particular theory, it was believed that the pressure and/or atmosphere within the EBPVD deposition/coating chamber (resulting from residual gases, especially oxygen, and carbon contamination from a graphite heater) were the cause of the zirconium oxide and carbide precipitates found in the coating.

For the burner rig test, NiAlCrZr coatings were deposited by HVOF to a thickness of about 60 micrometers on pin samples formed of René N5 (U.S. Pat. No. 6,074,602), with a nominal composition of, by weight, about 7.5% Co, 7.0% Cr, 6.5% Ta, 6.2% Al, 5.0% W, 3.0% Re, 1.5% Mo, 0.15% Hf, 0.05% C, 0.004% B, 0.01% Y, the balance nickel and incidental impurities. The approximate chemistry of the coatings was, in atomic percent, about 45% aluminum, about 10% chromium, about 0.5% zirconium, and the balance nickel and incidental impurities. A TBC was not deposited on the NiCrAlZr coatings. The pins were then subjected to a cyclic hot corrosion-oxidation cycle in a burner rig with a combined cycle of about fifteen minutes at about 1700° F. (about 930° C.) plus about five minutes at about 2075° F. (about 1135° C.). Testing was terminated when an approximately 0.1 inch (about 2.5 mm) diameter region of the superalloy was exposed due to environmental attack of the coating. One of the coatings performed exceedingly well, with a life of approximately 800 cycles, as compared to the typically observed life of about 300 to 400 cycles for the other NiAlCrZr coatings. After the test, a piece was cut from the cold section of the high-performing pin and metallographically mounted, polished and subjected to TOF-SIMS analysis, by which it was determined that the high-performing pin contained chromium oxide precipitates. The lower-performing pins were also analyzed and found to contain lower levels of chromium oxide. While not wishing to be held to any particular theory, it was believed that inadvertent variations in the fuel-to-oxygen ratio in the HVOF process resulted in the different oxide levels observed in the coatings.

From the results of the FCT and burner rig tests, it was speculated that the presence of reactive elements having a high affinity for oxygen, e.g. zirconium and chromium, when present in the form of very fine oxide and/or carbide particles at the coating interfaces (e.g., grain boundaries), may reduce the driving force for inward diffusion of oxygen during high temperature exposure, thereby reducing internal oxidation of a NiAl coating. In order to increase the strength of a beta-NiAl overlay coating by a dispersion strengthening mechanism, the particles must be present in a sufficient amount and size to be stable and unreactive at temperatures at which the coating will be exposed, e.g., up to about 1300 Å for gas turbine engine components. On this basis, it is envisioned that an effective size for the particles is in the sub-micron range, and that an effective particle content is not greater than about five volume percent. A particularly suitable particle size range is believed to be in a range of about 1 to about 2000 nanometers, more preferably about 10 to about 1000 nanometers, while a suitable particle content is believed to be 0.5 to less than 5 volume percent.

A fine dispersion of ceramic particles can be more consistently and controllably obtained by introducing $CH_4$, CO, $CO_2$, $N_2$, $NH_3$, and/or $O_2$ into a PVD or thermal spray coating chamber so as to react the reactive coating constituents (e.g., zirconium and chromium) during the coating process. Alternatively, the dispersions can be introduced with the source materials from which the coating is deposited. Using such techniques, it is believed that a suitable beta-NiAl overlay coating for use as a bond coat or an environmental coating contains up to about 0.8 atomic percent (about 1.4 weight percent) zirconium and up to about 15 atomic percent (about 18 weight percent) chromium, but with some of the zirconium and chromium content being present as oxides, carbides and/or nitrides.

It is recognized that the potent strengthening effect of oxide dispersion-strengthening (ODS) has been demonstrated in superalloys (e.g. MA754 and MA6000 alloys) with $Y_2O_3$ dispersions, as well as AlN precipitates in bulk (i.e., non-coating) beta-NiAl alloys. It is further noted that the concept of particle dispersion-strengthened MCrAlY and diffusion bond coats have been previously investigated. However, such coatings differ in composition and microstructure from the beta-NiAl overlay coatings that are the subject of the present invention. Furthermore, while it was previously recognized that limited quantities of zirconium can improve beta-NiAl overlay coatings through solid solution strengthening and intermetallic precipitation strengthening, the effect of higher zirconium contents in the form of carbide and oxide precipitates was not.

While the invention has been described in terms of a preferred embodiment, it is apparent that modifications could be adopted by one skilled in the art. For example, based on commonly-assigned U.S. Patent Nos. 5,975,852, 6,291,084, 6,153,313, 6,255,001 and 6,620,524, it is believed that the beta-NiAl overlay coatings of this invention could be modified to contain a reactive element other than zirconium, such as yttrium, cerium or hafnium, as well as other alloying ingredients, such as tantalum and silicon to result in the presence of oxides, nitrides, and carbides of tantalum and silicon. Accordingly, the scope of the invention is to be limited only by the following claims.

What is claimed is:

1. A coating system on a superalloy substrate, the coating system comprising a beta-phase NiAl intermetallic overlay coating containing zirconium in solid solution and a dispersion of ceramic particles selected from the group consisting of oxides, nitrides, and carbides of zirconium, the ceramic particles being present in an amount and size sufficient to be stable and unreactive at temperatures up to about 1300° C. and to increase the strength of the overlay coating by a dispersion strengthening mechanism.

2. A coating system according to claim 1, further comprising a thermal-insulating ceramic layer adhered to the overlay coating.

3. A coating system according to claim 1, wherein the overlay coating further contains chromium.

4. A coating system according to claim 1, wherein the overlay coating consists of nickel, aluminum, chromium, zirconium, and the dispersion of ceramic particles.

5. A coating system according to claim 1, wherein the overlay coating contains at least one reactive element selected from the group consisting of hafnium and yttrium.

6. A coating system according to claim 1, wherein the overlay coating further contains chromium and the ceramic particles comprise at least one compound selected from the group consisting of oxides, nitrides, and carbides of chromium.

7. A coating system according to claim 1, wherein the overlay coating contains zirconium and chromium in solid solution and the ceramic particles consist of oxides, carbides and/or nitrides of zirconium and chromium.

8. A coating system according to claim 1, wherein the overlay coating further contains at least one of tantalum and silicon.

9. A coating system according to claim 8, wherein the ceramic particles comprise at least one compound selected from the group consisting of oxides, nitrides, and carbides of tantalum and silicon.

10. A coating system according to claim 1, wherein the ceramic particles are present in an amount of about 0.5 to about 5.0 volume percent of the overlay coating.

11. A coating system according to claim 1, wherein the size of the ceramic particles is in a range of about 1 to about 2000 nanometers.

12. A coating system on a nickel-base superalloy substrate of a gas turbine engine component, the coating system comprising a ceramic layer on a beta-phase NiAlCr intermetallic overlay bond coal, the overlay bond coat consisting of nickel, aluminum, chromium, zirconium, and a dispersion of ceramic particles formed of at least one compound selected from the group consisting of oxides, nitrides, and carbides of chromium and zirconium, the ceramic particles being present in the overlay bond coat in an amount and size sufficient to be stable and unreactive at temperatures up to about 1300° C. and to increase the strength of the overlay bond coat by a dispersion strengthening mechanism.

13. A coating system according to claim 12, wherein the ceramic particles are present in an amount of 0.5 to less than 5.0 volume percent of the overlay coating.

14. A coating system according to claim 12, wherein the size of the ceramic particles is in a range of about 10 to about 1000 nanometers.

15. A coating system according to claim 12, wherein the chromium content of the overlay bond coat is about 2 to about 15 atomic percent, and some of the chromium content is in the ceramic particles.

16. A coating system according to claim 12, wherein the zirconium content of the overlay bond coat is about 0.05 to about 0.8 atomic percent, and some of the zirconium content is in the ceramic particles.

* * * * *